United States Patent [19]
Andoh

[11] Patent Number: 5,208,549
[45] Date of Patent: May 4, 1993

[54] AUTOMATIC POWER CONTROL APPARATUS FOR LINEAR MODULATION

[75] Inventor: Akira Andoh, Amagasaki, Japan

[73] Assignee: Mitsubishi Denki Kabushiki Kaisha, Tokyo, Japan

[21] Appl. No.: 747,963

[22] Filed: Aug. 21, 1991

[30] Foreign Application Priority Data

Aug. 22, 1990 [JP] Japan .................. 2-220550

[51] Int. Cl.⁵ .............................................. H03G 3/20
[52] U.S. Cl. ................................... 330/129; 330/279; 330/136
[58] Field of Search ............... 330/129, 127, 128, 279, 330/136, 144, 145, 284

[56] References Cited

U.S. PATENT DOCUMENTS

| | | | |
|---|---|---|---|
| 4,574,248 | 3/1986 | Snodgrass | 330/279 |
| 4,602,218 | 7/1986 | Vilmur et al. | 330/129 |
| 4,709,403 | 11/1987 | Kikuchi | 330/279 |
| 4,996,500 | 2/1991 | Larson et al. | 330/279 |
| 5,043,672 | 8/1991 | Youn | 330/129 |

Primary Examiner—Robert J. Pascal
Assistant Examiner—Tan Dinh
Attorney, Agent, or Firm—Rothwell, Figg, Ernst & Kurz

[57] ABSTRACT

An automatic power control apparatus has a level control circuit for adjusting the power level of a linearly modulated signal prior to amplification by a power amplifier, and a coupler for extracting part of the amplified signal. An envelope detector detects the envelope of the extracted signal. A dc component detecting means detects the dc component of the envelope signal. An error amplifier amplifies the difference between this dc component and a reference voltage, and a loop filter filters the amplified difference to produce a control voltage that controls the level control circuit, thus controlling the power of the amplified signal without being affected by ac components of the signal envelope.

3 Claims, 7 Drawing Sheets

AUTOMATIC POWER CONTROL APPARATUS FOR LINEAR MODULATION

BACKGROUND OF THE INVENTION

This invention relates to automatic power control apparatus for amplifying a linearly modulated signal to a constant transmitted power level. The term "linearly modulated" refers herein to modulation of a carrier signal in such a way that the modulated signal has a non-constant envelope. An example of linear modulation is the quadrature phase-shift keying (QPSK) modulation system used in digital communications.

Transmitters for frequency-modulated and other constant-envelope signals employ automatic power control apparatus to maintain a constant transmitted power level despite temperature changes or supply-voltage fluctuations. Prior-art automatic power control apparatus comprises a variable-gain power amplifier, part of the output of which is coupled to a power level detector that produces a voltage signal representing the power level of the amplifier output. The amplifier gain is controlled by feedback of the difference between this voltage signal and a reference voltage to the power amplifier through a loop filter.

When such apparatus is applied to linearly modulated signals, a problem arises. The feedback loop responds to the intrinsic amplitude variations in such signals and attempts to remove these variations by changing the amplifier gain. As a result, signal components that should be transmitted are lost, and the spectrum of the transmitted signal is undesirably broadened.

These problems can be alleviated by lowering the cutoff frequency of the loop filter, but then the transient response of the apparatus suffers. In particular, it takes extra time for the control loop to reach a steady state at the beginning of communication.

SUMMARY OF THE INVENTION

It is accordingly an object of the present invention to control the power of a linearly modulated signal without being affected by intrinsic amplitude variations in the modulated signal.

Another object of the invention is to reach a steady control state quickly.

An automatic power control apparatus has a level control circuit for adjusting the power level of a linearly modulated signal responsive to a control voltage, and a power amplifier for amplifying the adjusted modulated signal to produce an amplified signal. A coupler extracts part of the power of the amplified signal. An envelope detector detects the envelope of the extracted signal, thereby generating an envelope signal, and a dc component detecting means detects the dc component of the envelope signal.

A reference voltage selector selects a reference voltage, and an error amplifier amplifies the difference between the dc component and the reference voltage, thereby producing an error signal. A loop filter filters the error signal, thereby generating the control voltage that controls the level control circuit.

DETAILED DESCRIPTION OF THE INVENTION

The invention will be better understood from an explanation of the embodiments illustrated in the accompanying drawings. These drawings do not, however, limit the scope of the invention, which should be determined solely from the appended claims.

Figure 1:
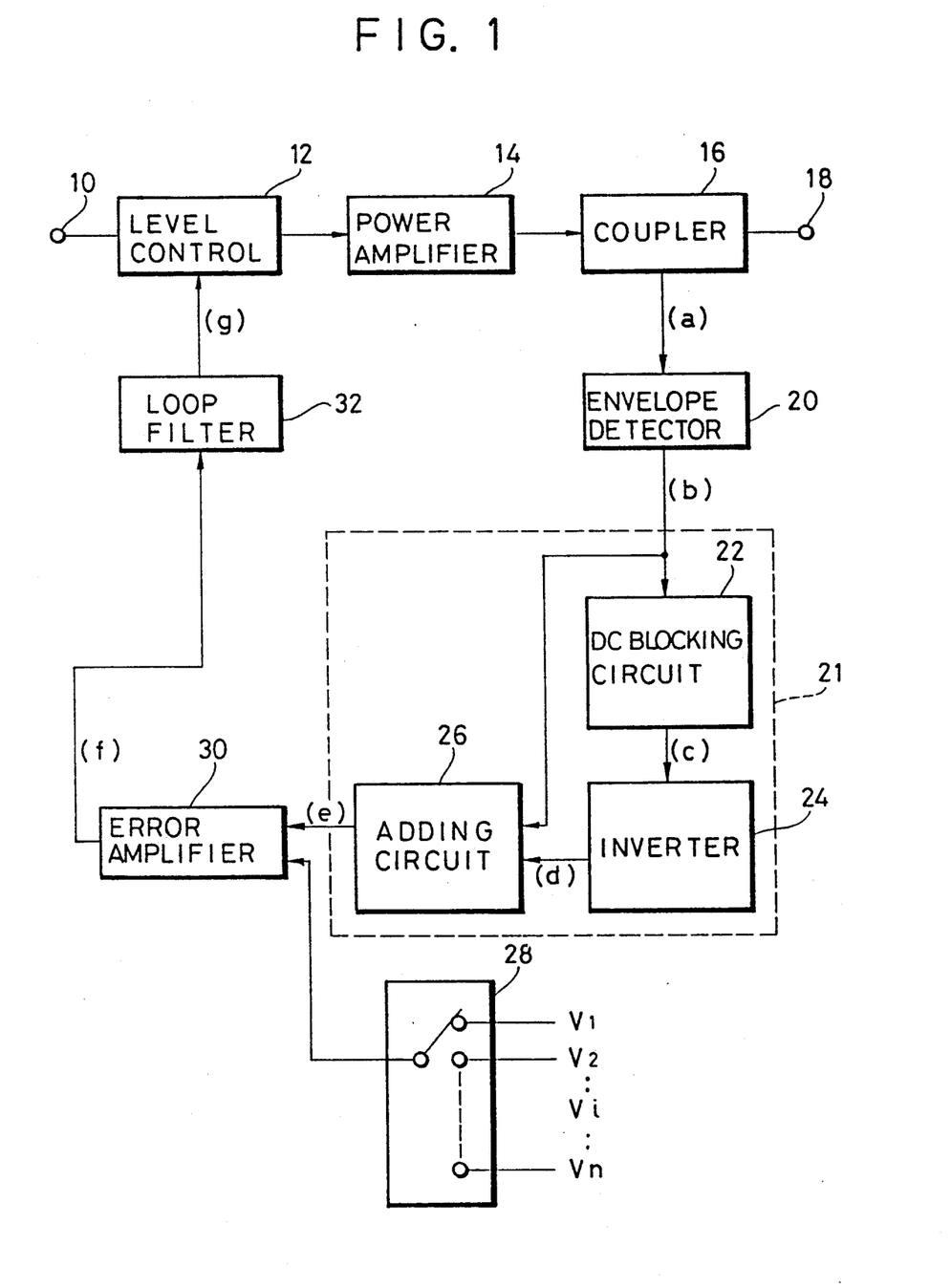
FIG. 1 is a block diagram of a novel automatic power control apparatus according to one preferred embodiment of the present invention.

Referring to FIG. 1, a novel automatic power control apparatus comprises an input terminal 10 at which a modulated signal is received, a level control circuit 12 that adjusts the level of the received modulated signal in a manner linearly responsive to a control voltage (g), and a power amplifier 14 that amplifies the modulated signal output from the level control circuit 12. The amplified signal is fed from the power amplifier 14 to a coupler 16, which extracts a small part of the power of the amplified signal, supplies the remaining part to an output terminal 18, and supplies the extracted signal (a) to an envelope detector 20. The output terminal 18 is connected to, for example, an antenna not shown in the drawing.

The envelope detector 20 produces an envelope signal (b) which it supplies to a dc component detecting means 21, which generates the dc component (e) of the envelope signal (b). The dc component detecting means 21 comprises a dc blocking circuit 22, an inverting circuit 24, and a voltage adding circuit 26. The envelope signal (b) is fed to both the dc blocking circuit 22 and the voltage adding circuit 26. The dc blocking circuit 22 produces the ac component (c) of the envelope signal (b), and supplies it to the inverting circuit 24. The inverting circuit 24 generates an inverted ac component (d), which it supplies to the voltage adding circuit 26. The voltage adding circuit 26 sums the envelope signal (b) and the inverted ac component (d) to generate the dc component (e).

The novel automatic power control apparatus also has a reference voltage selector 28 for selecting one of a number of reference voltages $V_1, V_2, \ldots, V_n$. The selected reference voltage $V_i$ and the dc component (e) are supplied to a error amplifier 30, which amplifies their difference to produce an error signal (f). The error signal (f) is filtered by a loop filter 32 and supplied as the control voltage (g) to the level control circuit 12 to adjust the level of the modulated signal.

Figure 2:
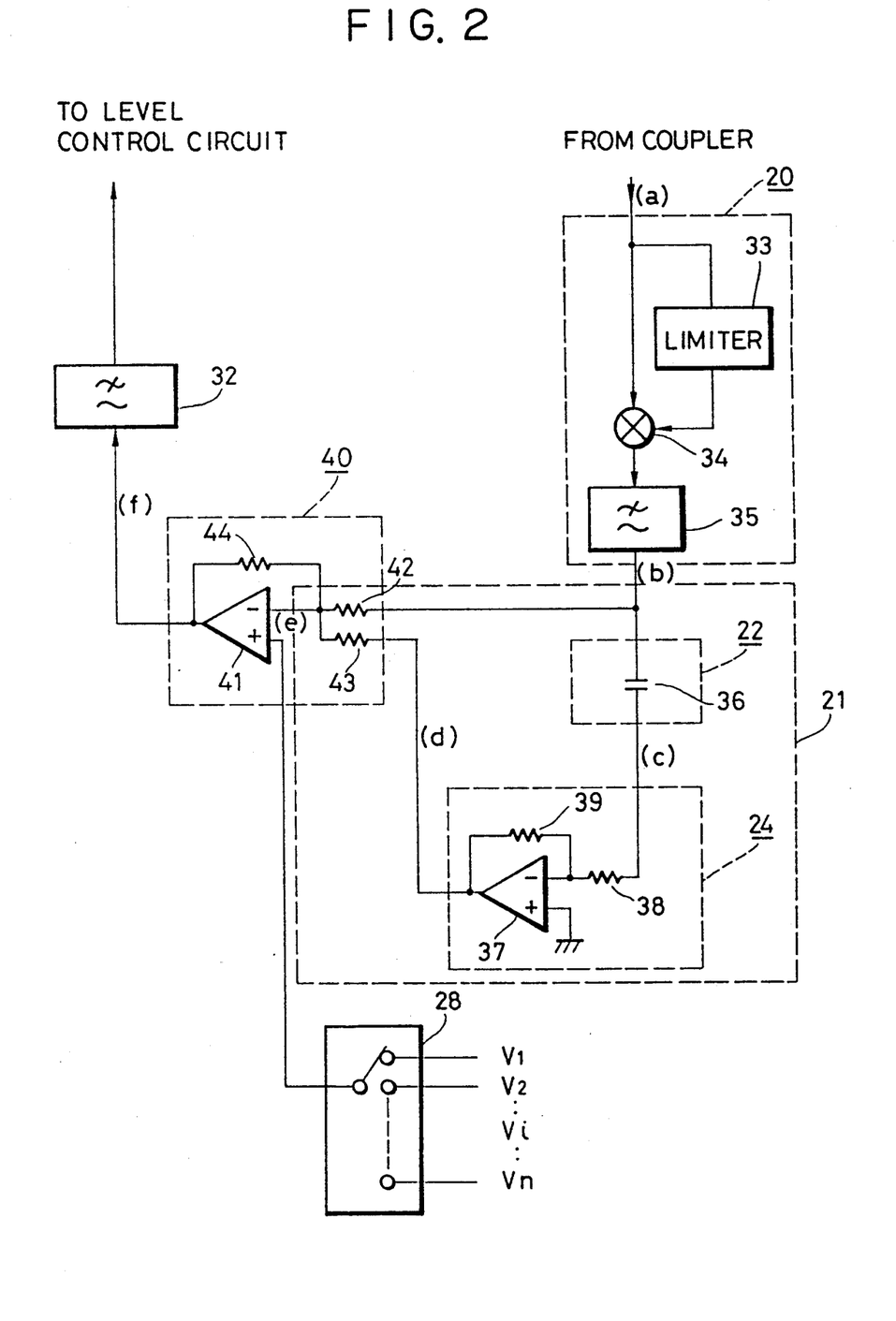
FIG. 2 is a circuit diagram illustrating part of the feedback loop in FIG. 1.

For example, the envelope detector 20, the dc component detecting means 21, and the error amplifier 30 comprise circuits shown in FIG. 2. The envelope detector 20 comprises a limiter 33 and an analog multiplier 34, both of which receive the extracted signal (a). The limiter 33 limits the extracted signal (a) to a constant-amplitude signal, which is fed to the analog multiplier 34. The analog multiplier 34 multiplies the extracted signal (a) by this constant-amplitude signal and provides the resulting product to a low-pass filter 35. The output of the low-pass filter 35 is the envelope signal (b).

In the dc component detecting means 21, the dc blocking circuit 22 comprises a capacitor 36 that blocks the dc component and passes only the ac component (c) of the envelope signal (b). The inverting circuit 24 comprises an operational amplifier 37 that receives the ac component (c) at its inverting input through a first resistor 38. The non-inverting input of the operational amplifier 37 is grounded. The output of the operational amplifier 37 is fed back to the inverting input through a second resistor 39.

The voltage adding circuit 26 and the error amplifier 30 in FIG. 1 are shown in FIG. 2 as combined into a single adding and error amplifying circuit 40 comprising an operational amplifier 41. The envelope signal (b) from the envelope detector 20 and the inverted ac component (d) from the inverting circuit 24 are both applied to the inverting input of the operational amplifier 41, the envelope signal (b) through a third resistor 42 and the inverted ac component (d) through a fourth resistor 43. After passage through their respective resistors, these two signals are combined by a wired-or connection to produce the dc component (e). The selected reference voltage $V_i$ from the reference voltage selector 28 is applied to the non-inverting input of the operational amplifier 41. The output of the operational amplifier 41 is sent as the error signal (f) to the loop filter 32.

The operation of the novel automatic power control apparatus will be explained with reference to FIGS. 1, 3 and 4.

Prior to the start of operation, the reference voltage selector 28 in FIG. 1 is set to select one of reference voltages $V_i$, the selection being made according to the desired power level of the amplified signal.

Figure 3:
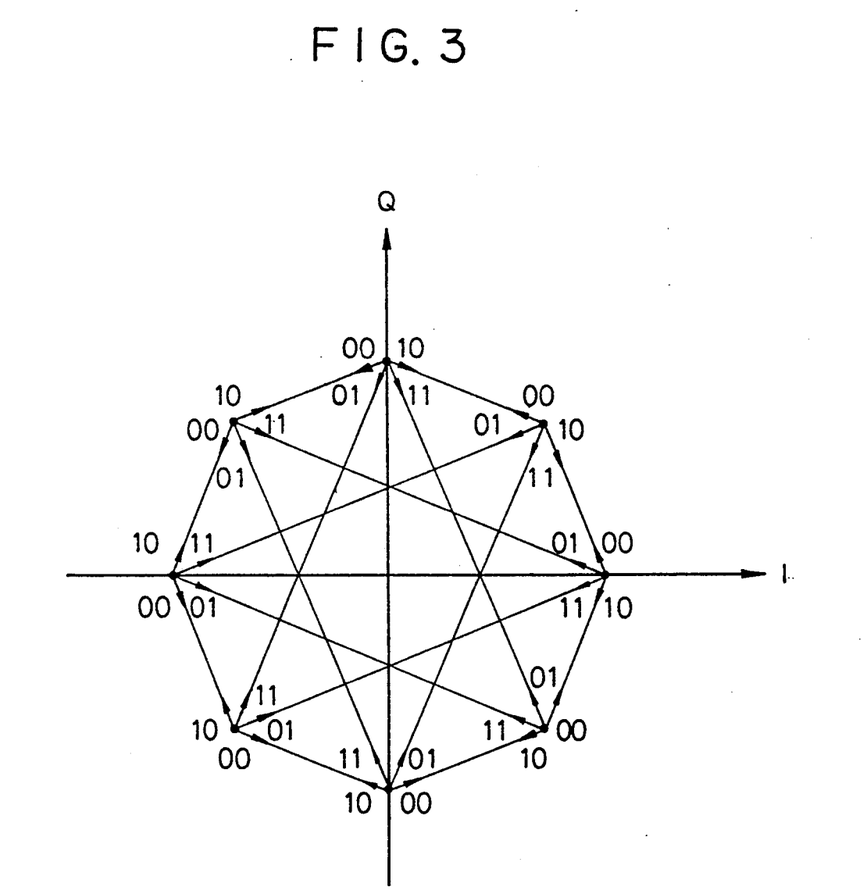
FIG. 3 is a phase transition diagram illustrating a linear modulation system.

FIG. 3 illustrates the commonly-used $\pi/4$-shift QPSK modulation scheme by showing transitions between phase angles on the complex (I-Q) plane. It can be seen that each successive pair of modulating bits causes the phase of the modulated signal to change by an odd multiple of $\pi/4$ radians. Although this modulation scheme avoids zero-radian phase changes (transitions through zero amplitude) that would produce a zero envelope, the modulated signal does not have a constant envelope, as will be shown in FIG. 4.

Figure 4:
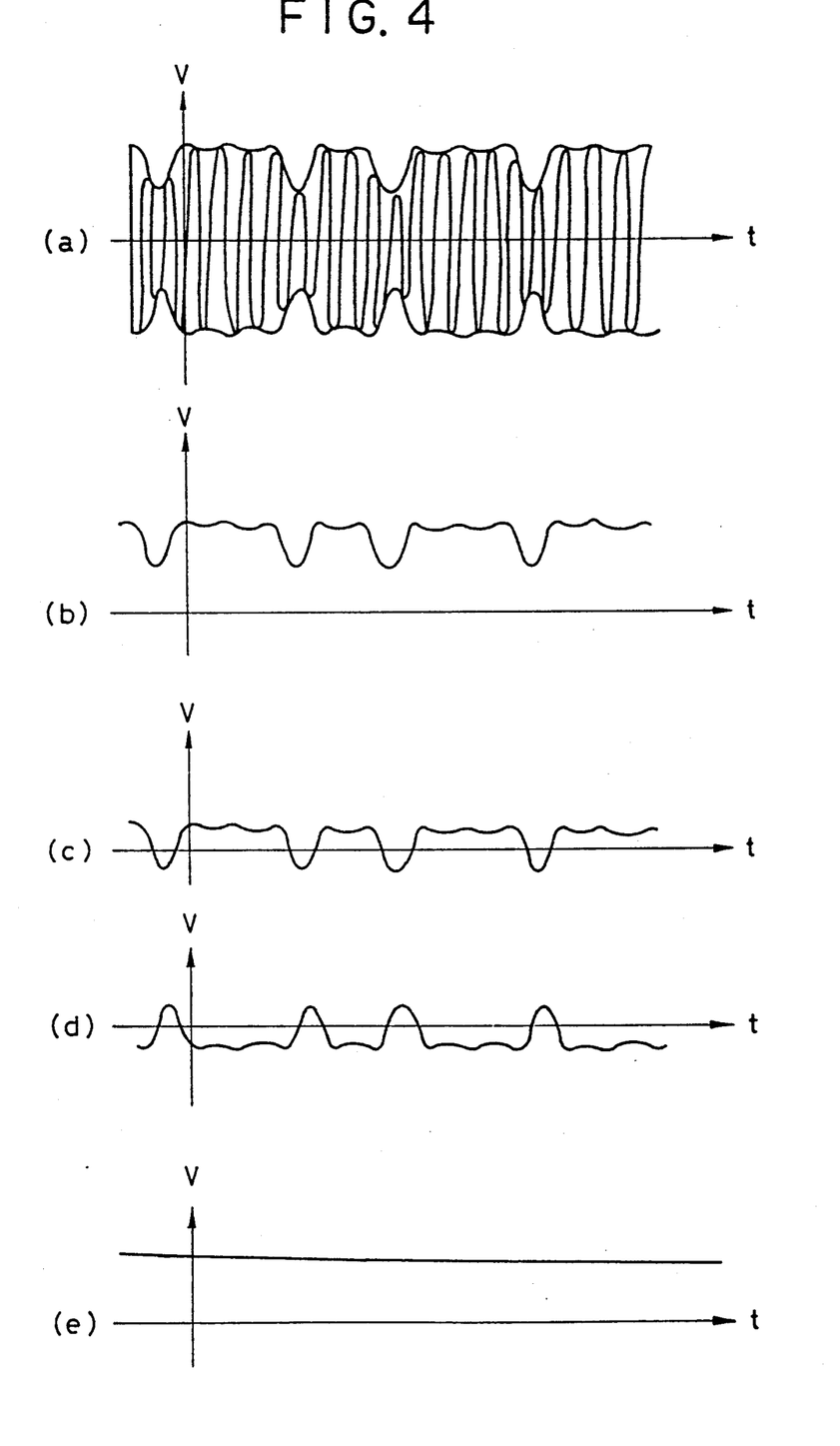
FIG. 4 is a waveform diagram illustrating signal waveforms at various points in FIG. 1.

FIG. 4 illustrates waveforms of the extracted signal (a), the envelope signal (b), the ac component (c), the inverted ac component (d), and the dc component (e) in FIGS. 1 and 2 when the modulation scheme in FIG. 3 is used. The modulated signal has both phase and amplitude variations, so the extracted signal (a) in FIG. 4 exhibits a non-constant envelope. The envelope signal (b) in FIG. 4 detected by the envelope detector 20 thus has both ac and dc components.

The dc component of the envelope signal (b) is blocked by the dc blocking circuit 22, leaving only the ac component (c) in FIG. 4. The inverting circuit 24 then produces the inverted ac component (d) in FIG. 4. The inverted ac component (d) is added to the envelope signal (b), producing the dc component (e) of the envelope signal (b), as shown at the bottom of FIG. 4.

Since the dc component (e) is applied to the inverting input of the operational amplifier 41 in FIG. 2, the loop in FIG. 1 operates as a negative feedback loop that maintains the dc component of the amplified signal in a substantially steady state selected by the reference voltage $V_i$. The loop filter 32 determines the response characteristics of the feedback loop.

Since the ac component of the envelope is removed by the dc component detecting means 21, the feedback loop does not respond to intrinsic variations in the signal envelope of the type illustrated in FIG. 3, but only to long-term variations such as those caused by temperature of power-supply fluctuations. The amplified signal can thus be maintained at the proper level without having control disrupted by envelope variations caused by the modulation scheme. Moreover, the cutoff frequency of the loop filter 32 can be set to a fairly high value, enabling correct control to be attained quickly at the beginning of a communication burst.

Figure 5:
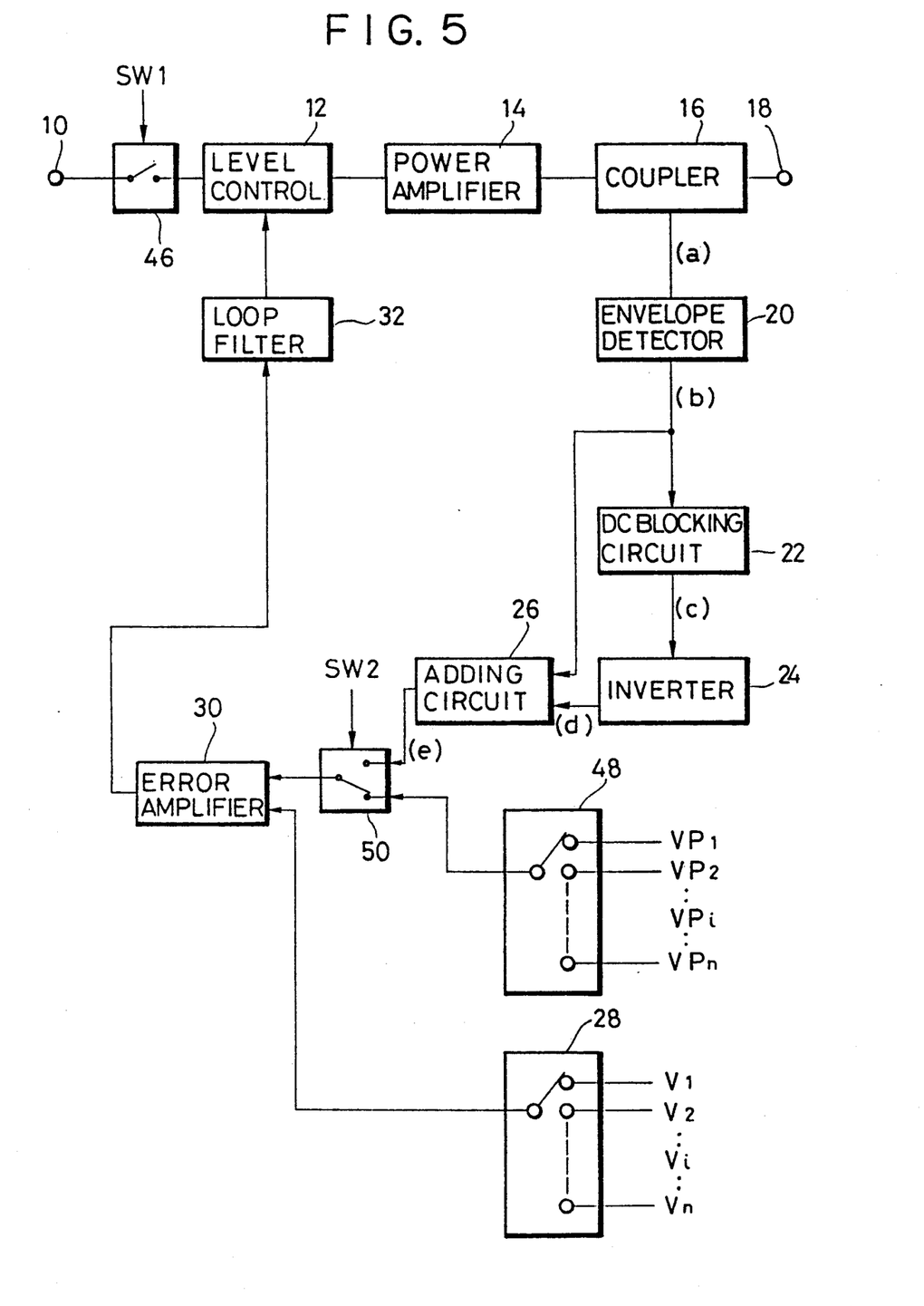
FIG. 5 is a block diagram of another novel automatic power control apparatus according to a second preferred embodiment of the present invention.

FIG. 5 shows another novel automatic power control apparatus which enables the transient time at the beginning of a burst to be further shortened. Elements identical to elements in FIG. 1 are indicated by the same reference numerals. Three new elements are added: a switching circuit 46 inserted between the input terminal 10 and the level control circuit 12, a preset voltage selector 48, and a selector switch 50 inserted between the voltage adding circuit 26 and the error amplifier 30 and connected to the preset voltage selector 48.

The switching circuit 46 switches the input to the level control circuit 12 on and off under control of an external signal (SW1). The preset voltage selector 48 selects one of a number of preset voltages $VP_1$, $VP_2$, . . . , $VP_n$. These voltages are substantially equal to the voltage outputs expected from the voltage adding circuit 26 in the steady state when respective reference voltages $V_1$, $V_2$, . . . , $V_n$ are selected by the reference voltage selector 28. The selector switch 50 selects either the output of the voltage adding circuit 26 or the output of the preset voltage selector 48 for input to the error amplifier 30.

Figure 6:
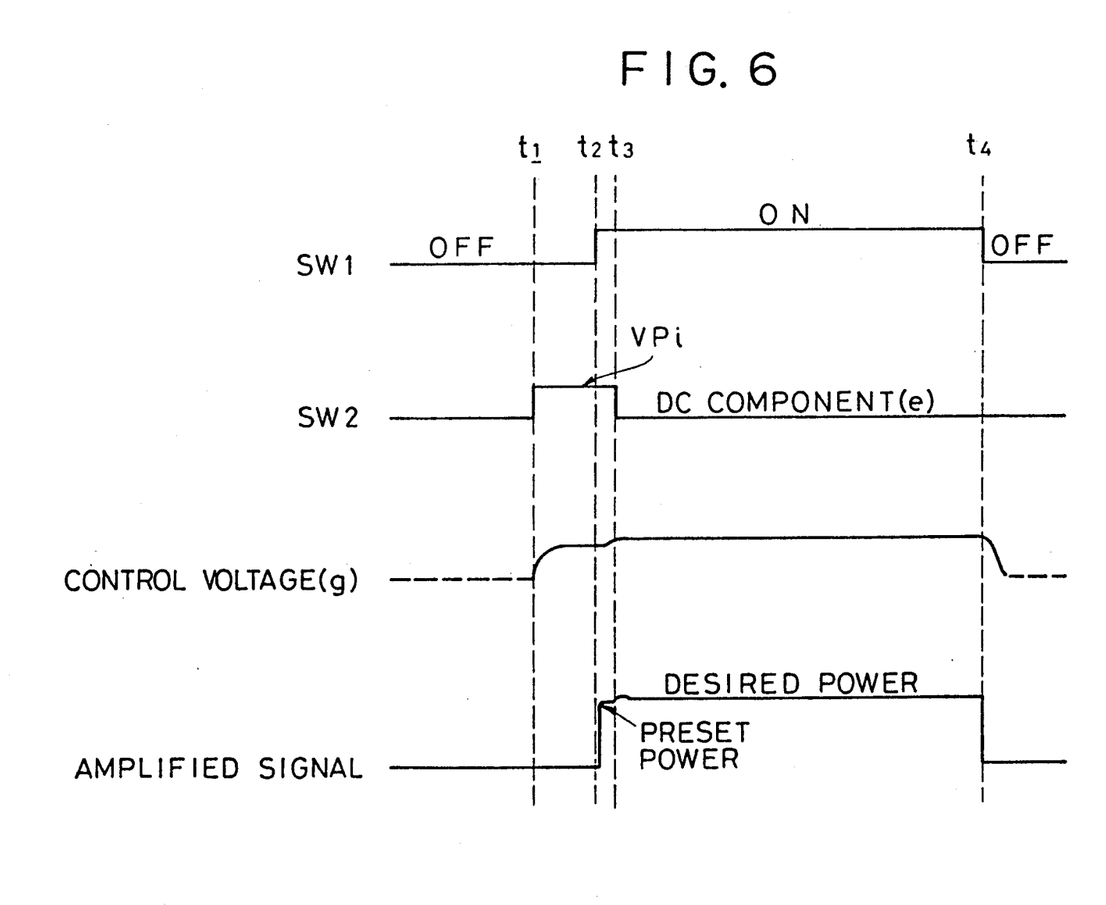
FIG. 6 is a timing diagram illustrating the operation of the automatic power control apparatus in FIG. 5.

The operation of the automatic power control apparatus in FIG. 5 will be explained with reference to FIG. 6.

Before the start of operation, the reference voltage selector 28 is set to the desired reference voltage $V_i$, and the preset voltage selector 48 is set to the corresponding preset voltage $VP_i$. When a burst is not being transmitted, the switching circuit 46 is turned off by the signal SW1 as shown in FIG. 6. Prior to the start of a burst, at time $t_1$, the selector switch 50 is set by the signal SW2 to select the preset voltage $VP_i$ for input to the error amplifier 30. When the burst begins at time $t_2$, the switching circuit 46 is switched on by the signal SW1. Output of the amplified signal at substantially the desired power level begins almost immediately, because the control voltage (g) is already at substantially the correct value. A short time is allowed for the amplified signal to reach the desired power level, then at time $t_3$ the selector switch 50 is switched by the signal SW2 to select the dc component (e) instead of $VP_i$. The automatic power control loop quickly settles into a steady state and continues to operate in that state. Negative feedback operates to maintain the desired power level until the end of the burst at time $t_4$, when the switching circuit 46 is switched off again.

The interval between times $t_1$ and $t_2$ should be long enough to allow the control voltage (g) to rise to a constant value corresponding to $VP_i$. The length of this interval depends on the characteristics of the loop filter 32. During this interval negative feedback does not operate, because the feedback loop has been opened by the selector switch 50.

The automatic power control apparatus in FIG. 5 has the same advantages as the automatic power control apparatus in FIG. 1, and in addition enables communication bursts to start cleanly at time $t_2$, with no time lost waiting for the control loop to reach a steady state.

Figure 7:
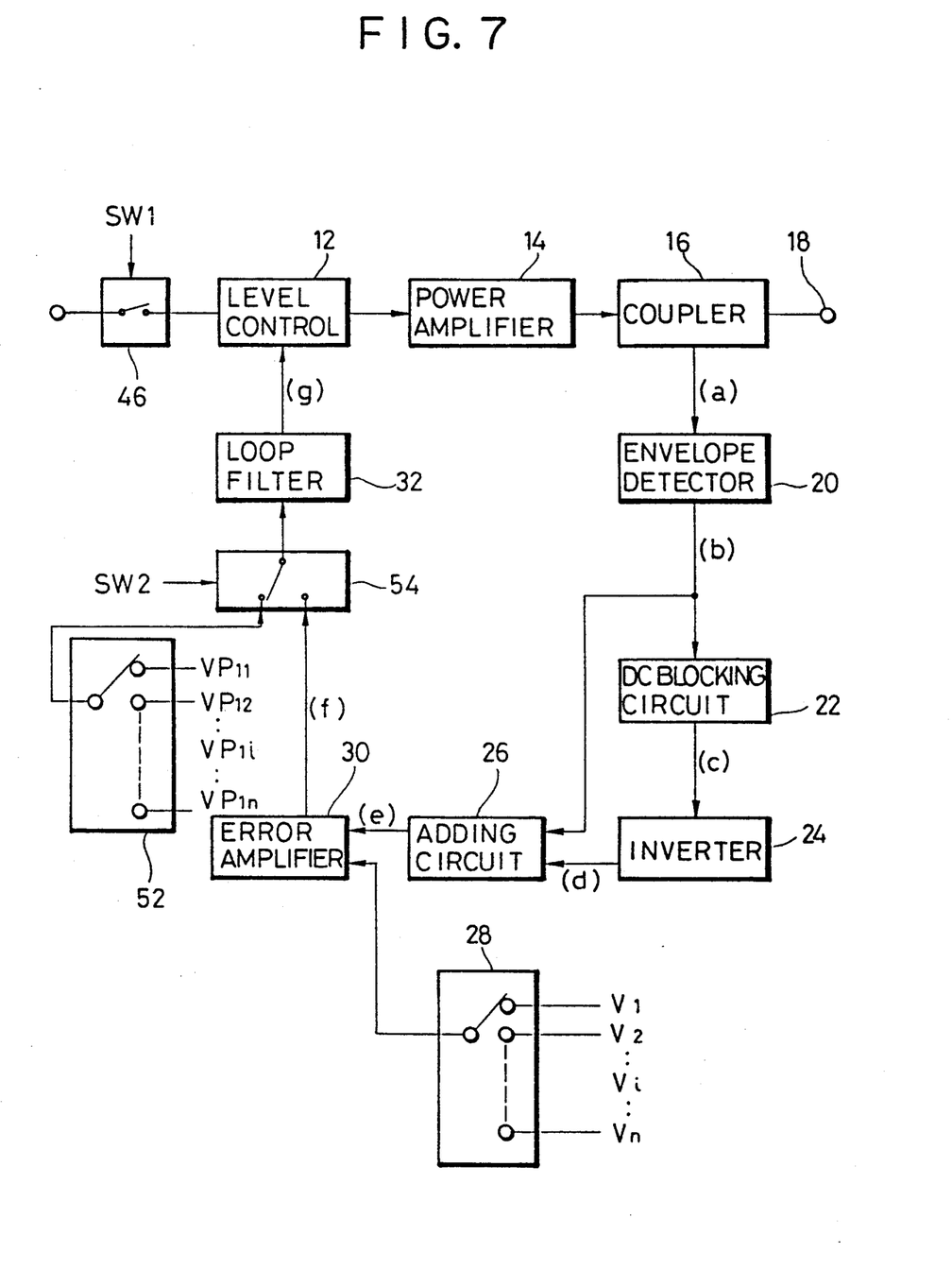
FIG. 7 is a block diagram of yet another novel automatic power control apparatus according to a third preferred embodiment of the present invention.

FIG. 7 shows another novel automatic power control apparatus that provides the same effects as the one in FIG. 5. Elements identical to elements in FIG. 5 are indicated by the same reference numerals. Instead of the preset voltage selector 48 in FIG. 5, the automatic power control apparatus in FIG. 7 has a preset voltage selector 52 that selects preset voltages $VP_{11}$, $VP_{12}$, ..., $VP_{1n}$ substantially equal to the error signal (f) expected from the error amplifier 30 in the steady state when corresponding reference voltages $V_1$, $V_2$, ..., $V_n$ are selected. Instead of the selector switch 50 in FIG. 5, the automatic power control apparatus in FIG. 7 has a selector switch 54 that selects either the error signal (f) or the output of the preset voltage selector 52 for input to the loop filter 32. The operation of the automatic power control apparatus in FIG. 7 is entirely analogous to the operation of the automatic power control apparatus in FIG. 5; further description will be omitted.

What is claimed is:

1. An automatic power control apparatus for a linearly modulated signal, comprising:

level control means for receiving the modulated signal and adjusting the power level thereof in response to a control voltage;

power amplifying means connected to said level control means, for receiving the adjusted modulated signal from said level control means and amplifying said adjusted modulated signal to produce an amplified signal;

coupling means connected to said power amplifying means, for extracting part of the power of said amplified signal, thereby producing an extracted signal;

envelope detecting means connected to said coupling means, for detecting an envelope of said extracted signal, thereby generating an envelope signal;

dc component detecting means connected to said envelope detecting means, for detecting a dc component of said envelope signal, including a dc blocking circuit connected to said envelope detecting means, for receiving said envelope signal and rejecting dc components therein, thus producing an ac component;

an inverting circuit connected to said dc blocking circuit, for inverting said ac component, thus producing an inverted ac component; and a voltage adding circuit connected to said envelope detecting means and said inverting circuit, for summing said envelope signal and said inverted ac component, thus producing said dc component;

reference voltage selecting means for selecting a reference voltage;

error amplifying means connected to said dc component detecting means and said reference voltage selecting means, for amplifying a difference between said dc component and said reference voltage, thereby producing an error signal; and loop filter means connected to said level control means and said error amplifying means, for filtering said error signal, thereby producing said control voltage.

2. The apparatus of claim 1, further comprising:

switching means connected to said level control means, for switching input of said modulated signal to said level control means on and off;

preset voltage selecting means for selecting a preset voltage; and selector switch means connected to said dc component detecting means, said preset voltage selecting means, and said error amplifying means, for selecting said dc component for input to said error amplifying means for a certain interval before input of said modulated signal to said level control means, and selecting said preset voltage for input to said error amplifying means after input of said modulated signal to said level control means begins.

3. The apparatus of claim 1, further comprising:

a switching circuit connected to said level control means, for switching input of said modulated signal to said level control means on and off;

a preset voltage selector for selecting a preset voltage; and selector switch means connected to said error amplifying means, said preset voltage selector, and said loop filter, for selecting said error signal for input to said loop filter for a certain interval before input of said modulated signal to said level control means, and selecting said preset voltage for input to said loop filter after input of said modulated signal to said level control means begins.

* * * * *

UNITED STATES PATENT AND TRADEMARK OFFICE
CERTIFICATE OF CORRECTION

PATENT NO. :   5,208,549
DATED      :   May 4, 1993
INVENTOR(S):   Akira Andoh

It is certified that error appears in the above-identified patent and that said Letters Patent is hereby corrected as shown below:

Col. 4, line 8, "of" should be --or--.

Signed and Sealed this

Fifth Day of April, 1994

Attest:

BRUCE LEHMAN

Attesting Officer

Commissioner of Patents and Trademarks